United States Patent
Naruse et al.

(10) Patent No.: US 12,252,401 B2
(45) Date of Patent: *Mar. 18, 2025

(54) CARBON NANOTUBE AGGREGATE

(71) Applicant: DENSO CORPORATION, Kariya (JP)

(72) Inventors: Jyunichi Naruse, Kariya (JP); Hajime Shingai, Kariya (JP); Takanori Yokoi, Kariya (JP); Katsuma Ishino, Kariya (JP)

(73) Assignee: DENSO CORPORATION, Kariya (JP)

( * ) Notice: Subject to any disclaimer, the term of this patent is extended or adjusted under 35 U.S.C. 154(b) by 210 days.

This patent is subject to a terminal disclaimer.

(21) Appl. No.: 17/388,224

(22) Filed: Jul. 29, 2021

(65) Prior Publication Data

US 2022/0033263 A1    Feb. 3, 2022

(30) Foreign Application Priority Data

Jul. 31, 2020    (JP) .................................. 2020-130986
Jul. 27, 2021    (JP) .................................. 2021-122195

(51) Int. Cl.
| | | |
|---|---|---|
| B32B 9/00 | (2006.01) |
| C01B 32/168 | (2017.01) |
| H01B 1/04 | (2006.01) |
| B82Y 30/00 | (2011.01) |

(Continued)

(52) U.S. Cl.
CPC ............. *C01B 32/168* (2017.08); *H01B 1/04* (2013.01); *B82Y 30/00* (2013.01); *B82Y 40/00* (2013.01); *C01B 2202/22* (2013.01); *C01B 2202/24* (2013.01); *C01B 2202/34* (2013.01); *C01B 2202/36* (2013.01); *C01P 2002/82* (2013.01); *C01P 2002/85* (2013.01); *C01P 2002/88* (2013.01); *C01P 2004/02* (2013.01);

(Continued)

(58) Field of Classification Search
CPC ... Y10T 428/30; Y10T 977/742; B82Y 30/00; B82Y 40/00
USPC ........................................................ 428/408
See application file for complete search history.

(56) References Cited

U.S. PATENT DOCUMENTS

| | | | |
|---|---|---|---|
| 2010/0117032 A1* | 5/2010 | Grigorian ............. | C01B 32/178 427/372.2 |
| 2010/0159222 A1* | 6/2010 | Hata ...................... | C01B 32/162 428/218 |
| 2014/0217330 A1* | 8/2014 | Worsley ................. | B01J 21/063 252/502 |

FOREIGN PATENT DOCUMENTS

| | | |
|---|---|---|
| JP | 2007-070155 A | 3/2007 |
| WO | 2018/147126 A1 | 8/2018 |

OTHER PUBLICATIONS

Mittal, et al., Photolysis-Driven, Room Temperature Filling of Single-Wall Carbon Nanotubes, Journal of Nanoscience and Nanotechnology 2019; 19: 4129-4135.*

(Continued)

*Primary Examiner* — Daniel H Miller
(74) *Attorney, Agent, or Firm* — Posz Law Group, PLC

(57) ABSTRACT

A carbon nanotube aggregate includes a plurality of carbon nanotubes, a metal compound added to inside and/or outside of each of the carbon nanotubes, and an oxide film that is made of an oxide of the metal compound, and covers an outer periphery of the plurality of carbon nanotubes to define an outer surface of the carbon nanotube aggregate. Since the metal compound is shielded from the atmosphere by the oxide film, separation of the metal compound and reaction of the metal compound with oxygen or water in the atmosphere are suppressed, increasing heat resistance of the carbon nanotube aggregate.

4 Claims, 8 Drawing Sheets

(51) Int. Cl.
*B82Y 40/00* (2011.01)
*H10N 10/856* (2023.01)

(52) U.S. Cl.
CPC ...... *C01P 2004/50* (2013.01); *C01P 2006/10* (2013.01); *H10N 10/856* (2023.02); *Y10T 428/30* (2015.01)

(56) References Cited

OTHER PUBLICATIONS

Monthioux, et al., Hybrid carbon nanotubes: Strategy, progress, and perspectives, J. Mater. Res. 2006; 21: 2774-2793 (hereinafter Monthioux at _).*
Cargnello, et al., Multiwalled Carbon Nanotubes Drive the Activity of Metal@oxide Core-Shell Catalysts in Modular Nanocomposites, J. Am. Chem. Soc. 2012; 134.*
Kim et al., "Role of Anions in the AuCl3-Doping of Carbon Nanotubes", American Chemical Society, Published online Jan. 5, 2011, vol. 5 No. 2, pp. 1236-1242, www.acsnano.org; cited on p. 1 of the Specification.
Xie et al., "Dispersing and doping carbon nanotubes by poly (p-styrene-sulfonicacid) for high-performance and stable transparent conductive films", ElsevierLtd., Accessed online Apr. 3, 2020, pp. 151-156.
U.S. Appl. No. 17/388,246, filed Jul. 29, 2021, Naruse et al.

* cited by examiner

G BAND PEAK POSITION (cm$^{-1}$)

| SAMPLE | BEFORE HEATING TEST | AFTER HEATING TEST |
|---|---|---|
| C-1 | 1593 | — |
| C-2 | 1601 | 1596 |
| C-3 | 1609 | 1609 |

CARBON NANOTUBE AGGREGATE

CROSS REFERENCE TO RELATED APPLICATION

The present application claims the benefit of priority from Japanese Patent Application No. 2020-130986 filed on Jul. 31, 2020 and Japanese Patent Application No. 2021-122195 filed on Jul. 27, 2021. The entire disclosures of the above applications are incorporated herein by reference.

TECHNICAL FIELD

The present disclosure relates to an aggregate of carbon nanotubes (hereinafter referred to as CNT).

BACKGROUND

A CNT aggregate made of a plurality of CNTs is expected to be applied to conductive films and windings. In recent years, there is a demand for lowering electrical resistance due to miniaturization of devices. As a method for lowering the electrical resistance, it is known to conduct a doping treatment to dope CNTs with $AuCl_3$, for example, as disclosed in Non-Patent Literature 1.

Non-Patent Literature 1: Kim et al., Role of Anions in the $AuCl_3$-Doping of Carbon Nanotubes, ACS NANO 2011, vol. 5, No. 2, 1236-1242

SUMMARY

The present disclosure describes a CNT aggregate having a high heat resistance. The CNT aggregate includes a plurality of CNTs, a metal compound added to the inside and/or the outside of the CNTs, and an oxide film made of an oxide of the metal compound and covering an outer periphery of the CNT aggregate.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1:
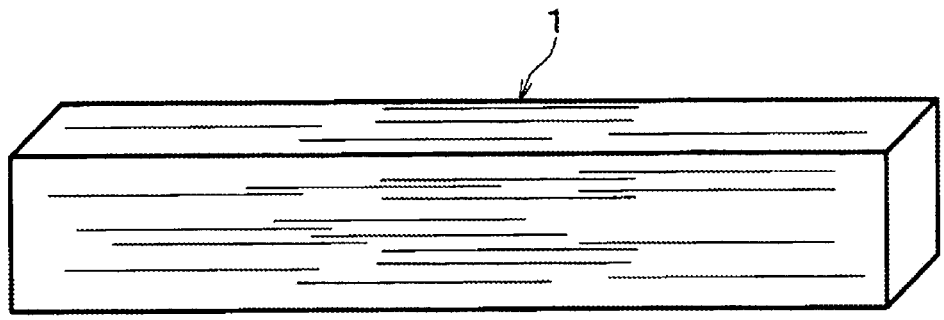
FIG. 1 is a diagram showing an external view of a CNT aggregate according to a first embodiment.

In addition to the lowering of the electrical resistance, CNT aggregates are required to cope with high temperature environments such as for vehicle motors. For example, even if the CNT aggregates are left in the atmosphere of at least 200° C. or higher for 100 hours or longer, it is required that the resistance change is small and the electrical resistance is maintained. However, in a conventional method, such as in a method of Patent Literature 1, although the effect of lowering the electrical resistance is maintained at a temperature of about 100° C., the effect of lowering the electrical resistance is degraded at a temperature of 200° C. or higher. This is considered because of deterioration due to the release of dopant or the reaction with oxygen and water in the atmosphere.

Further, for n-type CNT materials for thermoelectric materials, a technique of adding an alkali element such as lithium or potassium or a composite of potassium ion and crown ether to the inside of the CNT has been proposed. However, the stability at 200° C. or higher in the atmosphere has not been confirmed. Further, there are few cases in which a p-type dopant, which is more stable in the atmosphere than the n-type dopant, is added to the inside of the CNT. Also, there is no case that exhibits the heat resistance for 100 hours or longer in the atmosphere of 200° C. or higher.

The present disclosure provides a high heat resistance CNT aggregate.

According to an aspect of the present disclosure, a CNT aggregate includes a plurality of CNTs, a metal compound added to the inside and/or the outside of the CNTs, and an oxide film made of an oxide of the metal compound and covering an outer periphery of the CNT aggregate.

In such a configuration, since the metal compound is shielded from the atmosphere by the oxide film covering the surface of the CNT aggregate, the separation of the metal compound and the reaction between the metal compound and oxygen and water in the atmosphere are suppressed. As such, the heat resistance of the CNT aggregate improves.

The following describes embodiment and examples of the present disclosure with reference to the drawings. In the following embodiment and examples, the same or equivalent parts are denoted by the same reference numerals as each other, and the descriptions thereof will not be repeated.

First Embodiment

Figure 2:
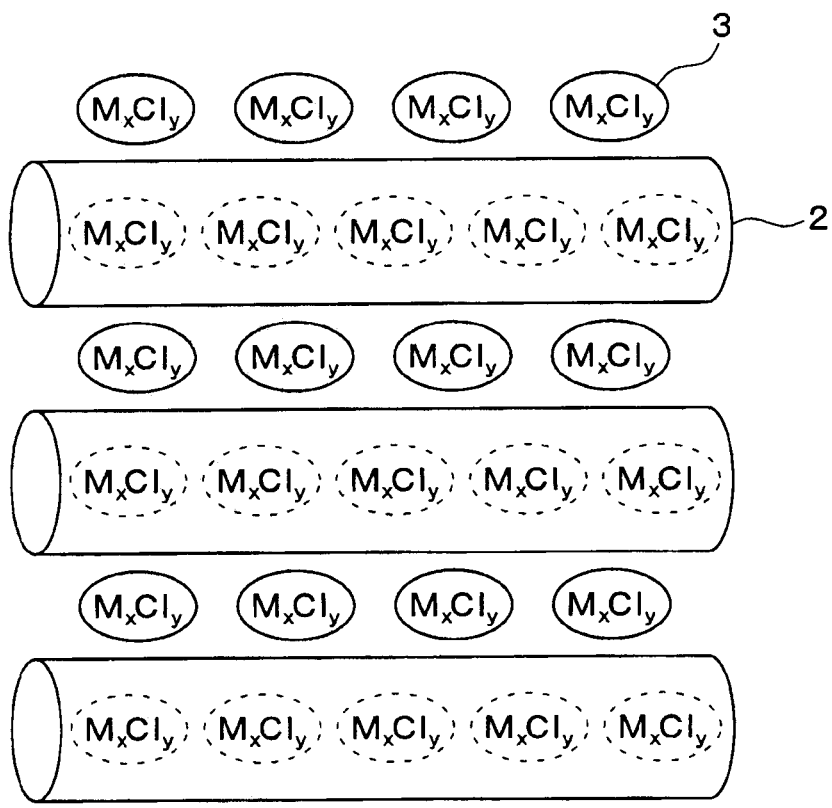
FIG. 2 is a diagram showing an internal configuration of the CNT aggregate.

A first embodiment will be described. A CNT aggregate 1 of the present embodiment is formed by aggregating a plurality of CNTs 2 to have a rod-shaped or tape-shaped structure, as shown in FIG. 1 and FIG. 2. The CNT aggregate 1 is used, for example, in CNT conductive films, CNT windings for devices, CNT windings for motors, CNT wire harnesses, and the like. The length of one side of the CNT aggregate 1 is, for example, 10 μm or more. In a case where the CNT aggregate 1 has a quadrangular pillar shape having a quadrangle in a cross-section, the length of one side of the quadrangle is, for example, 10 μm or more. In a case where the CNT aggregate 1 has a columnar shape, the diameter of the CNT aggregate 1 is, for example, 10 μm or more. The density of the CNT aggregate 1 is, for example, 0.8 g/cm$^3$ or more. The average inner diameter of the plurality of CNTs 2 is, for example, 0.55 nm or more and 1000 nm or less.

As shown in FIG. 2, in the CNT aggregate 1, a metal compound 3 such as a metal chloride is added to the inside and the outside of the CNTs 2 in order to reduce the electrical resistance. Here, a case where molybdenum chloride ($MoCl_5$) is added as the metal compound 3 will be described. In FIG. 2, the CNTs 2 having a columnar shape are shown for the sake of simplicity. Further, the metal compound 3 added to the inside of each of the CNTs 2 is shown by a broken line, and the metal compound 3 added to the outside of the CNT 2 is shown by a solid line.

Figure 3:
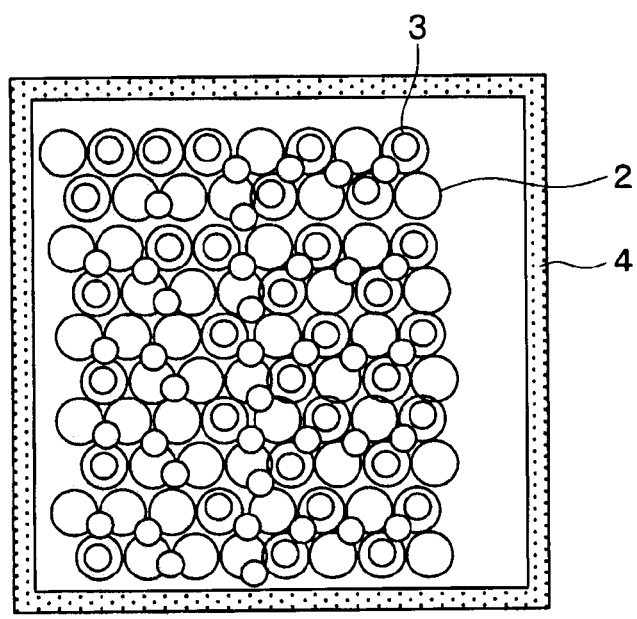
FIG. 3 is a diagram showing a cross-sectional view of the CNT aggregate.

As shown in FIG. 3, the surface of the CNT aggregate 1 is covered with an oxide film 4 made of an oxide of the metal compound 3. In other words, the oxide film 4 forms an outer surface of the CNT aggregate 1. The oxide film 4 functions to shield the metal compound 3 from the atmosphere, and suppresses the separation of the metal compound 3 and the reaction between the metal compound 3 and oxygen or water in the atmosphere. In a case where $MoCl_5$ is added as the metal compound 3, the oxide film 4 is made of molybdenum oxide ($MoO_3$, $MoO_2$) or molybdenum chloride partial oxide ($MoO_xCl_{5-x}$, e.g., $0.1 \le x < 5$).

Such a CNT aggregate 1 is produced, for example, by the following procedure. First, a CNT film, which is made of DexMat Inc. (USA), is placed in a vacuum and heated at 500° C. or higher to remove moisture inside a CNT 2. Next, after mixing the CNT film and $MoCl_5$ gas in an Ar atmosphere in which $O_2$ is 1 ppm to 20 ppm, the CNT film is sealed in a container to be shielded from the atmosphere and heated at 260° C. to 350° C. Then, $MoCl_5$ on the surface of the CNT film is removed by washing with ethanol.

In this way, $MoCl_5$ is added as the metal compound 3 inside and/or outside the CNTs 2, and the CNT aggregate 1 whose surface is covered with an oxide film 4 such as $MoO_2$ is produced. In this production method, the surface of the CNT aggregate 1 is covered with the oxide film 4, and openings of the CNT 2 are capped with $MoO_2$ or the like, which is an oxide of the metal compound 3.

Figure 4:
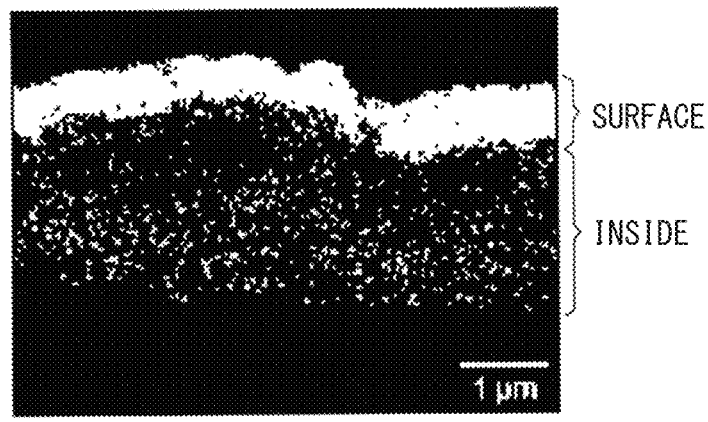
FIG. 4 is a photomicrograph showing the content of molybdenum.
Figure 5:
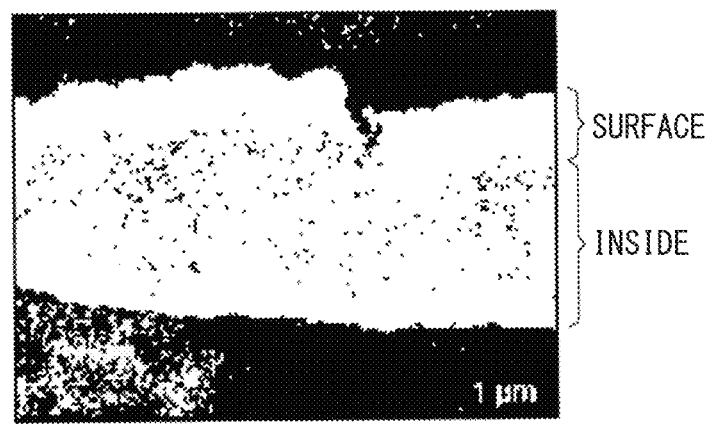
FIG. 5 is a photomicrograph showing the content of oxygen.
Figure 6:
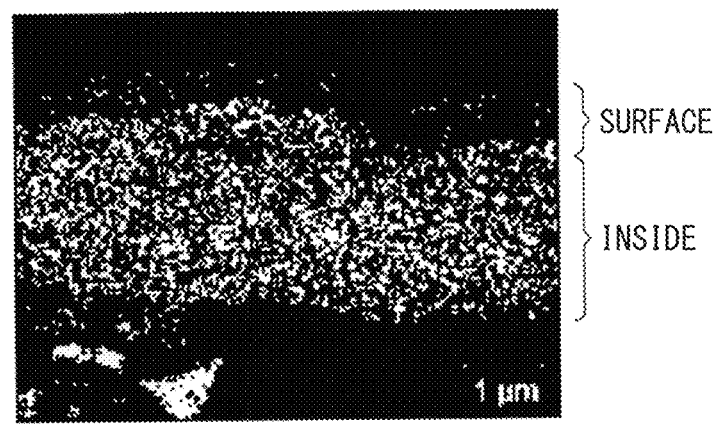
FIG. 6 is a photomicrograph showing the content of chlorine.

FIGS. 4 to 6 are scanning electron micrographs of a cross section of the CNT aggregate 1 produced by the method described above, and show the contents of molybdenum, oxygen, and chlorine in the inside and on the surface of the CNT aggregate 1. In each of FIGS. 4 to 6, the white area has a higher content of molybdenum, oxygen, and chlorine than the black area. As shown in FIGS. 4 to 6, the surface of the CNT aggregate 1 has higher contents of molybdenum and oxygen and a lower content of chlorine than the inside of the CNT aggregate 1. Accordingly, it is appreciated that the oxide film 4 mainly composed of molybdenum and oxygen is formed on the surface of the CNT aggregate 1.

Figure 7:
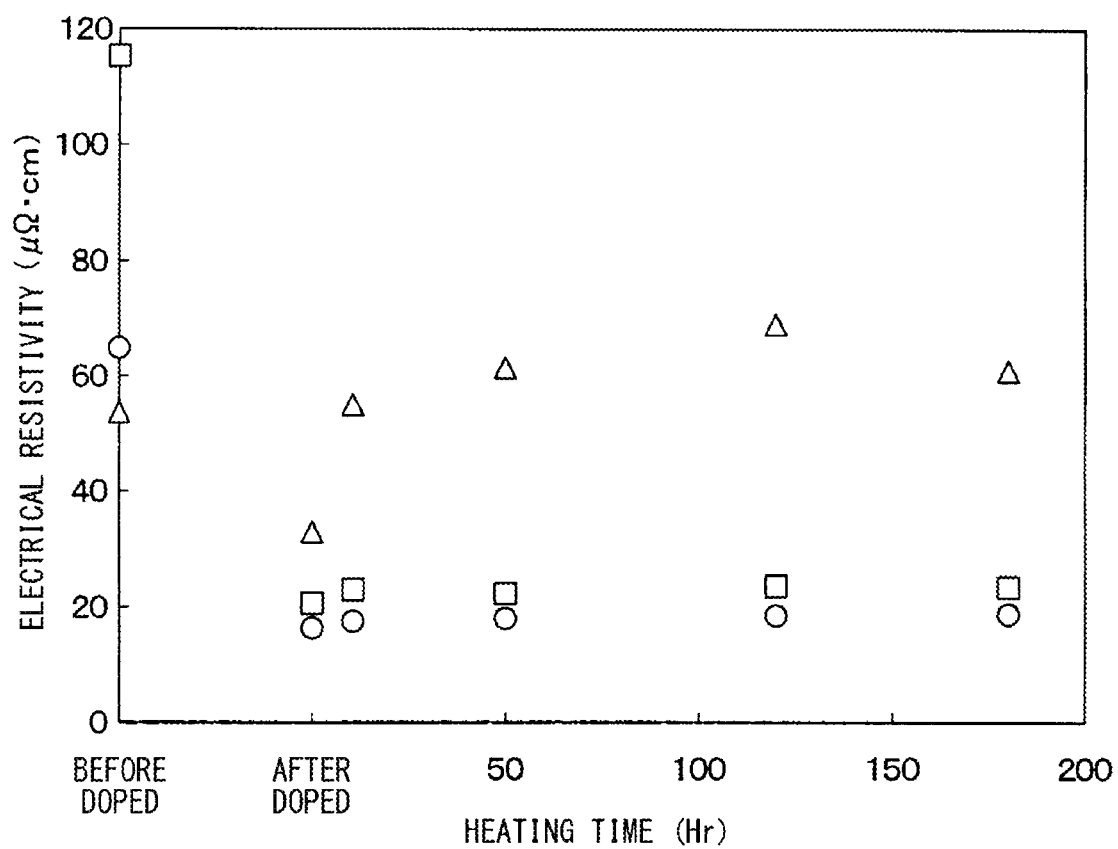
FIG. 7 is a diagram showing a relationship between heating time and electrical resistance.

FIG. 7 is a graph showing the results of examining the heat resistance of the CNT aggregate 1 produced by the method described above. In FIG. 7, the horizontal axis represents a heating time when a heating test is performed at 230° C. in the atmosphere, and the vertical axis represents an electrical resistivity measured by a four-terminal measurement method at room temperature after removing the CNT aggregate from a heating device. In FIG. 7, white circles indicate the electrical resistivity of the CNT aggregate 1 in which a molybdenum oxide film thicker than 1 nm and thinner than 10 nm is formed on the surface. White squares indicate the electrical resistivity of the CNT aggregate 1 in which a molybdenum oxide film having a thickness of 10 nm is formed on the surface. Further, the white triangles indicate the electrical resistivity of a CNT aggregate to which $AuCl_3$ is added and in which no oxide film is formed on the surface.

As shown in FIG. 7, when the CNT aggregate in which the oxide film is not formed on the surface is heated at 230° C., the electrical resistance increases in a short time to the level of that before the addition of $AuCl_3$. On the other hand, in the CNT aggregate 1 in which the oxide film 4 is formed on the surface, the electrical resistance does not increase significantly even after heated for a long time and is kept small.

In the present embodiment, as described above, the electrical resistance of the CNT aggregate 1 is lowered as the metal compound 3 is added to the inside and outside of the CNTs 2. In addition, since the surface of the CNT aggregate 1 is covered with the oxide film 4 made of the oxide of the metal compound 3, the metal compound 3 is shielded from the air. As a result, the heat resistance is improved as compared with the conventional aggregate. The heat resistance of 200° C. or higher can be achieved.

Further, in a case where openings of the CNTs 2 are capped with the oxide of the metal compound 3, the metal compound 3 inside the CNTs 2 is shielded from the air. In such a case, the heat resistance is further improved.

The improvement of the heat resistance can also be confirmed in a doping test in which the CNT film is doped with $FeCl_3$. In this case, as the CNT film, GALVORN CNT TAPE manufactured by DexMat INC. (USA) was used. The initial resistance of the CNT film was 33.8±6.9 μΩcm. When this CNT film was subjected to a heat treatment at 350° C. for 1 hour in the air, the initial resistance after the heat treatment was 61.2±8.4 μΩcm. Further, the following three types of samples, C-1, C-2, and C-3, were prepared, in which the sample C-1 was a CNT film after the heat treatment and the samples C-2 and C-3 were the CNT films further subjected to a doping treatment after the heat treatment. Specifically, the sample C-1 was a CNT film subjected to the heat treatment only, the sample C-2 was a CNT film doped with IBr after the heat treatment, and the sample C-3 was a CNT film doped with $FeCl_3$ after the heat treatment. In the sample C-3, 99.9% pure anhydrous $FeCl_3$ made by Sigma Aldrich was used without purification and added as a dopant. In the sample C-2, 98% pure IBr made by Sigma Aldrich was used without purification and added as a dopant. In the doping treatment, the CNT film and the dopant were both placed in a closed container filled with an inert gas, and the treatment was carried out at 270° C. for 24 hours. After the doping treatment, the CNT film was washed with ethanol several times to remove excess dopant adsorbed on its surface.

Figure 8:
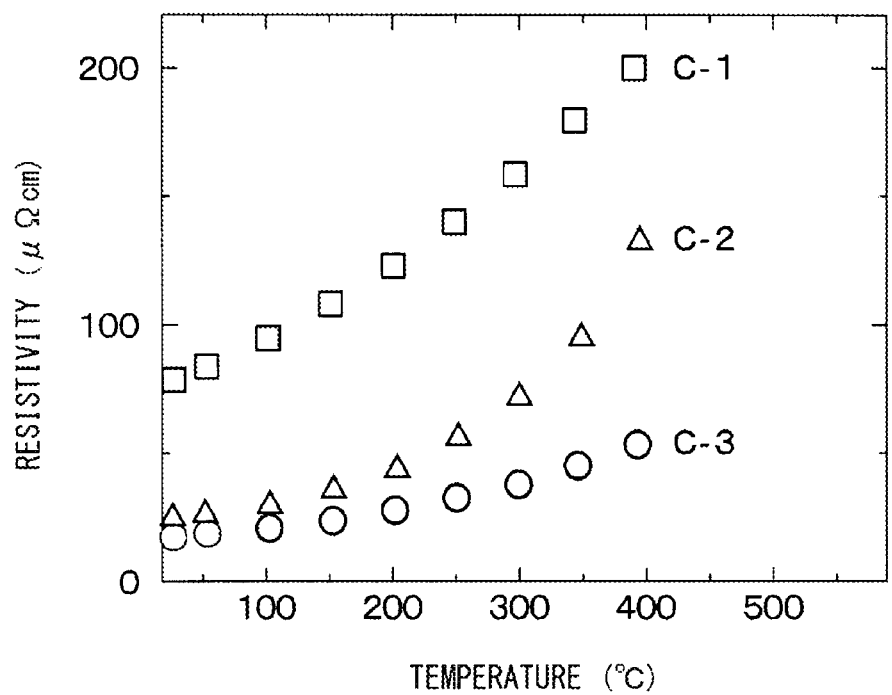
FIG. 8 is a diagram showing the temperature dependence of electrical resistivity of samples C-1 to C-3.

Then, in order to investigate the temperature dependence on the electrical resistivity, the electrical resistivity of each of the samples C-1 to C-3 under an inert gas atmosphere were measured. The electrical resistivity was measured at a rate in which the temperature was increased by 25° C. per minute. FIG. 8 shows the measurement results. As shown FIG. 8, the electrical resistivity of all three types of the samples C-1 to C-3 was increased by the heating from the room temperature. In particular, the rate of increase in the electrical resistivity of the sample C-3 with the increase in the temperature was lower than that of the sample C-2, and the rate of change was also small.

In addition, the thermal stability was confirmed by analyzing the characteristics of the doped CNT film. In the analysis, a Raman spectroscopic analysis (hereinafter referred to as Raman), an X-ray photoelectron spectroscopic analysis (hereinafter referred to as XPS) and a thermogravimetric/differential thermal analysis (hereinafter referred to as TG-DTA) were performed. In the Raman, an excitation wavelength of 532 nm was used, and a confocal Raman microscope, InVia Qontor made by Renishaw (UK) was used. In the XPS, PHI 5000 VersaProve II made by ULVAC-PHI, Inc. (JAPAN) was used, X-rays were focused on a spot size having a diameter of 200 μm on the sample under 50 W. As an X-ray source, Al-Kα ray (hv=1486.6 eV) was used. In the TG-DTA performed for the evaluation of the thermal stability of each sample, TG-DTA 6300 made by Hitachi High-Technologies Corporation (JAPAN) was used. In the TG-DTA, the measurement temperature range was 40° C. to 1000° C., and under the condition that the scanning speed was increased by +10.0° C. per minute, the air was introduced at 100 mL per minute using an alumina pan.

Figure 9A:
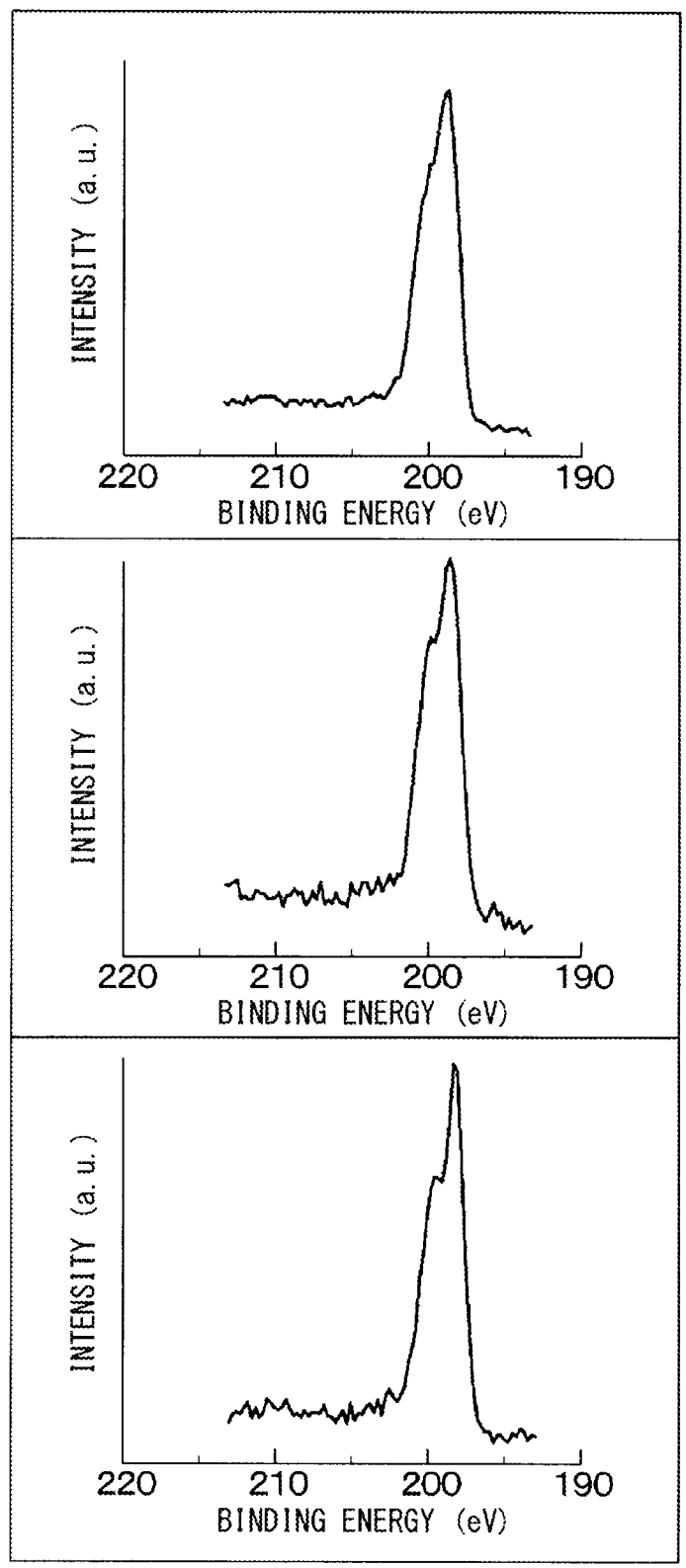
FIG. 9A is a diagram showing the intensity of an X-ray photoelectron spectroscopic analysis (XPS) spectrum with respect to the binding energy of a Cl 2p region in the sample C-3.
Figure 9B:
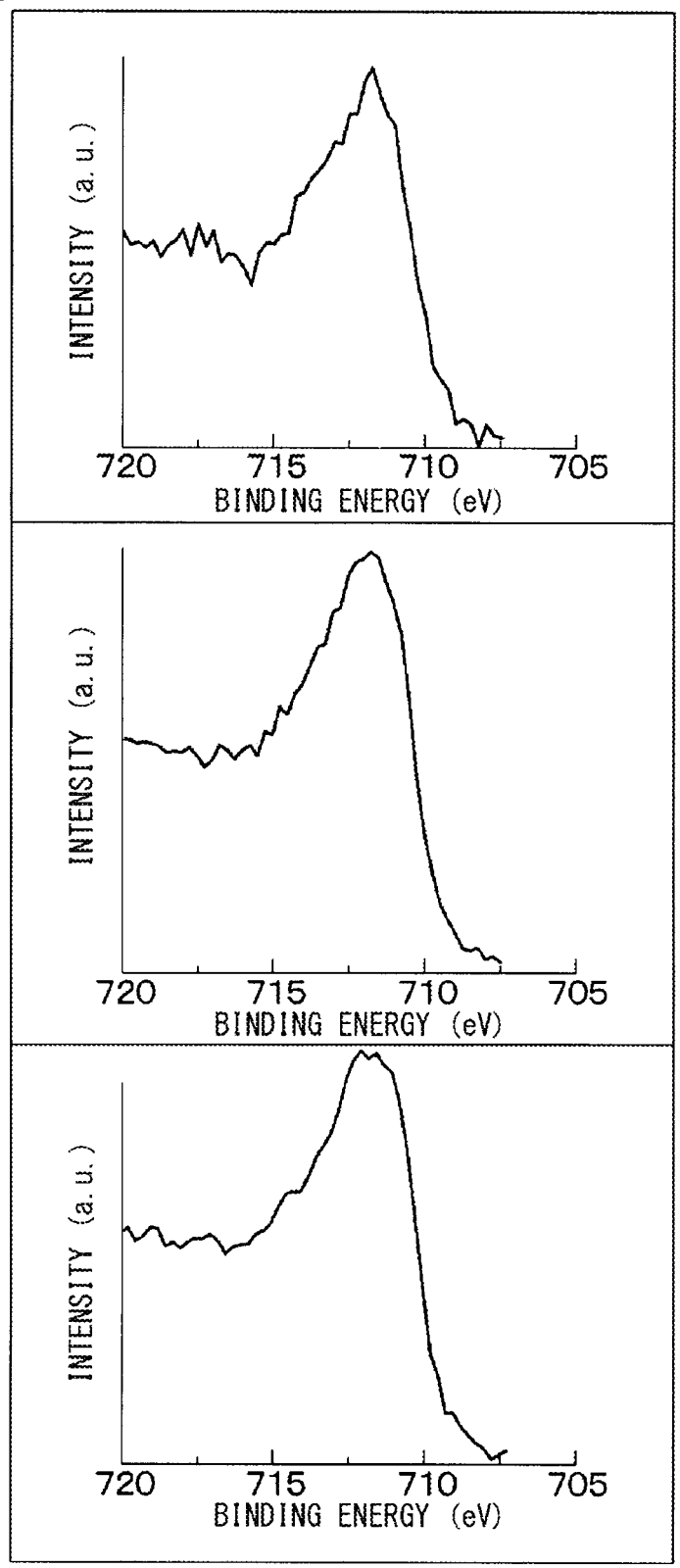
FIG. 9B is a diagram showing the intensity of the XPS spectrum with respect to the binding energy of a Fe 2p region in the sample C-3.

In the XPS measurement, in order to detect Fe and Cl inside the CNT doped with $FeCl_3$, attention was paid to the peaks in the Fe 2p region near 712 eV and the Cl 2p region near 198 eV. FIGS. 9A and 9B show the relationship between the binding energy (eV) and the intensity (a.u.) of the XSP spectrum, respectively, in the Cl 2p region near 198 eV of the sample C-3 and the Fe 2p region near 712 eV of the sample C-3. In each of FIGS. 9A and 9B, the top spectrum shows the result before heating, the middle spectrum shows the result after heating for 50 hours, and the bottom spectrum shows the result after heating for 120 hours.

As can be seen from FIGS. 9A and 9B, in the XPS spectrum of the sample C-3, peak disappearance and peak shape change were not observed in the region of interest before the heating and after the heating. Therefore, it can be said that $FeCl_3$ is retained in the CNT even at a high temperature of about 220° C., which is assumed when the CNT aggregate 1 is applied to a motor or the like.

Figures 10, 11:
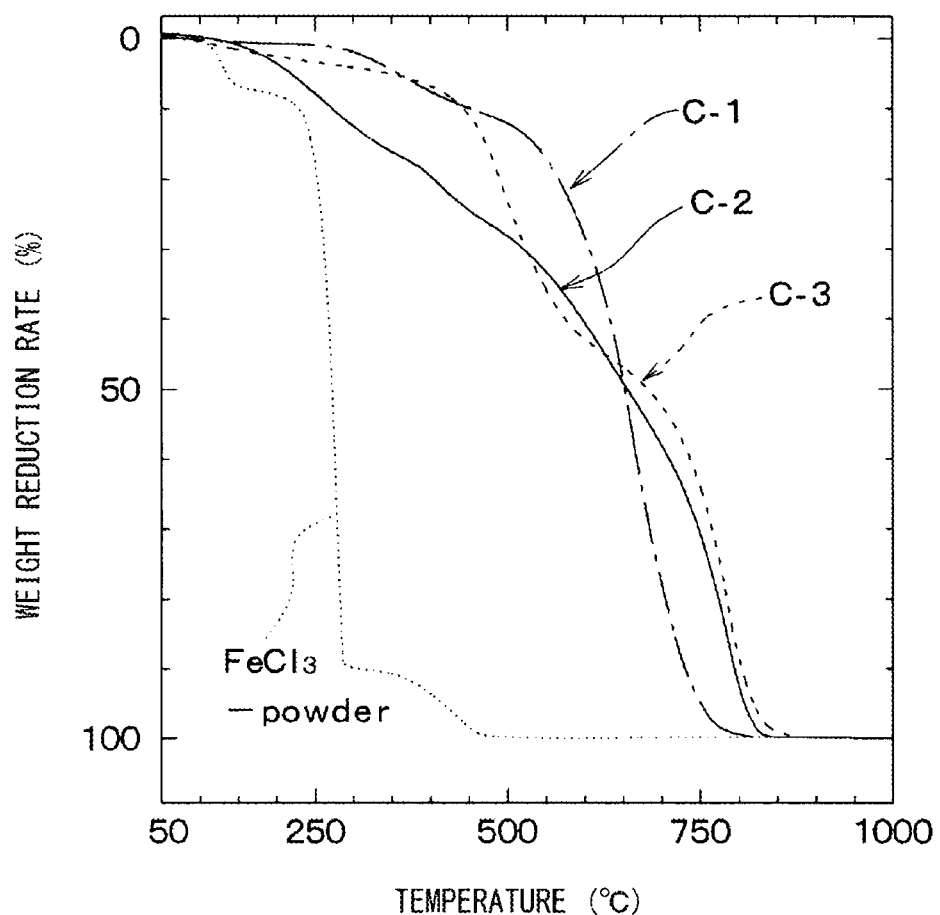
FIG. 10 is a diagram showing the measurement results of G band peak positions of the samples C-1 to C-3 in a Raman spectrum.
FIG. 11 is a diagram showing the results of thermogravimetric/differential thermal analysis (TG-DTA) in the samples C-1 to C-3 and $FeCl_3$ powder.

Also, the shift of the G band peak position in the Raman spectrum reflects the state of p-type doping in the CNT. FIG. 10 shows the results of measurement of the G band peak position of the Raman spectrum using excitation light having an excitation wavelength of 532 nm in the samples C-1 to C-3. A high-temperature standing test was performed on each sample, and the G band peak positions before and after the heat treatment in the high-temperature leaving test were measured. However, the sample C-1 was an undoped sample and was considered to have no change in the G band peak positions before and after the heat treatment. Therefore, only the measurement result before the heat treatment is shown for the sample C-1.

In the results of the high temperature standing test, the G band peak positions of the samples C-2 and C-3 before the heat treatment were 1601 $cm^{-1}$ and 1609 $cm^{-1}$, respectively. Thus, as compared with the peak position 1593 $cm^{-1}$ of the sample C-1, the peak shifts of the sample C-2 and C-3 are large, in proportion to the change in resistivity. On the other hand, in the results of the samples C-2 and C-3 after the heat treatment, the G band peak position of the sample C-2 was 1596 $m^{-1}$, whereas the G band position of the sample C-3 did not change before and after the heat treatment. This suggests that, in the sample C-3, the p-type doping state is retained before and after the heat treatment.

In the TG-DTA, the analysis was performed on the samples C-1 to C-3 and $FeCl_3$ powders. As a result, $FeCl_3$ showed different thermal stability with and without doping, as shown in FIG. 11. That is, it was confirmed that the thermogravimetric analysis (TG) of the $FeCl_3$ powder alone shows a weight reduction from around 200° C., while the sample C-3 shows a rapid weight reduction from around 500° C. and from around 700° C. In the sample C-3, since the rapid weight reduction and the gradient in the temperature range around 500° C. and around 700° C. were substantially the same as those of the sample C-1, it can be inferred that the weight reduction is due to the weight reduction of the CNT itself. In the $FeCl_3$ powder alone, it can be inferred that the weight reduction is due to the weight reduction of the $FeCl_3$ itself. Accordingly, it is considered that $FeCl_3$ contained in the CNT and the CNT are thermally stable, relative to the simple substance. This feature was also confirmed in the sample C-2, and it can be said that it supports the result of improvement in thermal stability due to inclusion of another substance.

Other Embodiments

The present disclosure is not limited to the above embodiment, and can be appropriately modified in various ways.

For example, in the embodiment described above, $MoCl_5$ is added to the CNT aggregate 1 as the metal compound 3. Alternatively, another metal chloride may be added, or a metal compound other than the metal chloride may be added. For example, $FeCl_3$ may be added. Further, the metal compound 3 may be added only to the inside of the CNTs 2 or may be added only to the outside of the CNTs 2.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A carbon nanotube aggregate comprising:
   a plurality of carbon nanotubes;
   a metal compound added to inside and/or outside of each of the carbon nanotubes; and
   an oxide film formed from a metal oxide including a metal of the metal compound, and covering an outer periphery of the plurality of carbon nanotubes to define an outer surface of the carbon nanotube aggregate,
   wherein
   the oxide film is formed from molybdenum oxide,
   the oxide film entirely covers the outer periphery of the plurality of carbon nanotubes while capping openings at longitudinal ends of each of the plurality of carbon nanotubes, and shields the metal compound from the atmosphere,
   the oxide film has a thickness of 1 nm or more and 10 nm or less,
   the metal compound is molybdenum chloride,
   a content of molybdenum at the outermost surface of the carbon nanotube aggregate provided by the oxide film is larger than a content of molybdenum inside of each of the carbon nanotubes and in spaces between the carbon nanotubes,
   a content of oxygen at the outermost surface of the carbon nanotube aggregate provided by the oxide film is larger than a content of oxygen inside each of the carbon nanotubes and in the spaces between the carbon nanotubes, and
   a content of chlorine at the outermost surface of the carbon nanotube aggregate provided by the oxide film is smaller than a content of chlorine inside of each of the carbon nanotubes and in the spaces between the carbon nanotubes.

2. The carbon nanotube aggregate according to claim 1, wherein the metal oxide includes a partial oxide of molybdenum chloride.

3. The carbon nanotube aggregate according to claim 1, wherein the carbon nanotube aggregate has a quadrangular pillar shape in which a length of one side is 10 μm or more, or a columnar shape having a diameter of 10 μm or more.

4. The carbon nanotube aggregate according to claim 1, wherein a density of the plurality of carbon nanotubes is 0.8 g/cm$^3$ or more.

* * * * *